(12) United States Patent
Kim et al.

(10) Patent No.: US 12,566,359 B2
(45) Date of Patent: Mar. 3, 2026

(54) APPARATUS AND METHOD FOR ADJUSTING ATTITUDE OF A TARGET OBJECT

(71) Applicant: HANWHA TECHWIN CO., LTD., Seongnam-si (KR)

(72) Inventors: Chang Yeon Kim, Seongnam-si (KR); Won Joon Kong, Seongnam-si (KR); Kyoung Jae Lee, Seongnam-si (KR)

(73) Assignee: HANWHA TECHWIN CO., LTD., Seongnam-si (KR)

( * ) Notice: Subject to any disclaimer, the term of this patent is extended or adjusted under 35 U.S.C. 154(b) by 102 days.

(21) Appl. No.: 18/200,770

(22) Filed: May 23, 2023

(65) Prior Publication Data

US 2024/0004274 A1      Jan. 4, 2024

(30) Foreign Application Priority Data

Jun. 29, 2022   (KR) ........................ 10-2022-0079903
Sep. 2, 2022   (KR) ........................ 10-2022-0111142

(51) Int. Cl.
 *G03B 17/56*       (2021.01)
 *F16M 11/12*       (2006.01)
 *G01R 33/07*       (2006.01)

(52) U.S. Cl.
 CPC ......... *G03B 17/561* (2013.01); *F16M 11/126* (2013.01); *G01R 33/07* (2013.01)

(58) Field of Classification Search
 CPC ........... G01L 3/102; G01L 3/105; G01B 7/30; H04N 7/18; H04N 7/181; H04N 7/183; G03B 17/561
 See application file for complete search history.

(56) References Cited

U.S. PATENT DOCUMENTS

| | | | |
|---|---|---|---|
| 10,955,432 B2 | 3/2021 | Karlsson | |
| 2002/0124663 A1* | 9/2002 | Tokumoto | ............... G01L 3/104 |
| | | | 73/862.333 |
| 2019/0260386 A1* | 8/2019 | Raman | .................. H03M 3/356 |
| 2020/0096844 A1* | 3/2020 | Liao | ..................... G03B 15/006 |
| 2021/0211013 A1* | 7/2021 | Tsuji | ..................... H02K 5/225 |
| 2023/0095065 A1* | 3/2023 | Saito | ...................... G01D 5/145 |
| | | | 324/207.25 |
| 2024/0288515 A1* | 8/2024 | Kim | ...................... H02K 11/30 |

FOREIGN PATENT DOCUMENTS

| | | |
|---|---|---|
| EP | 3 954 973 A1 | 2/2022 |
| KR | 10-2175887 B1 | 11/2020 |

* cited by examiner

*Primary Examiner* — Noam Reisner
(74) *Attorney, Agent, or Firm* — Sughrue Mion, PLLC

(57)        ABSTRACT

Embodiments of the present disclosure relate to an apparatus and method for adjusting an attitude of a target object. An attitude adjusting apparatus includes: a driving device that includes a motor that generates a driving force; and a controller that adjusts an attitude of a target object by referring to a rotation angle of the motor. The driving device includes: a sensing module that generates a magnetic field and senses a change of the magnetic field; and a target that rotates by the driving force of the motor, the target including one blade that changes the magnetic field generated by the sensing module, and the controller determines the rotation angle of the motor by referring to the change of the at least one magnetic field sensed after a preset waiting time has elapsed from a point in time at which rotation of the motor is terminated.

16 Claims, 19 Drawing Sheets

500

301, 302

330

331

380

360

361

363

360

361

362

500

APPARATUS AND METHOD FOR ADJUSTING ATTITUDE OF A TARGET OBJECT

CROSS-REFERENCE TO RELATED APPLICATIONS

This application is based on and claims priority under 35 U.S.C. § 119 from Korean Patent Application No. 10-2022-0079903, filed on Jun. 29, 2022, and Korean Patent Application No. 10-2022-0111142, filed on Sep. 2, 2022, in the Korean Intellectual Property Office, the disclosures of which are incorporated by reference herein in their entireties.

BACKGROUND

1. Field

Embodiments of the present disclosure relate to an apparatus and method for adjusting an attitude, and more particularly, to an attitude adjusting apparatus and method for adjusting an attitude of a target object through feedback control.

2. Description of Related Art

A camera may be used to monitor a target place. A user may monitor a corresponding place by referring to an image captured by the camera.

When the camera is pointed at only one point, a monitoring area may be limited. Accordingly, a pan tilt device may be mounted on the camera to change a shooting direction of the camera. The pan tilt device may change the shooting direction automatically or at a user's request, and the camera may perform shooting in the changed shooting direction.

A Hall sensor may be used to sense a rotation angle of a motor included in the pan tilt device. The Hall sensor may sense the rotation angle of the motor by sensing a magnetic field. Rotation of the motor may be controlled by referring to the rotation angle of the motor sensed by the Hall sensor.

On the other hand, the need for precise control of a change of the monitoring area of the camera is increasing. Therefore, there is a need for sensing the rotation angle of the motor with higher accuracy.

SUMMARY

According to embodiments of the present disclosure, an attitude adjusting apparatus and method for adjusting an attitude of a target object through feedback control are provided.

According to embodiments of the present disclosure, since a rotation angle of a motor is sensed without determining a position of a blade, there is an advantage of enabling an attitude adjustment of a target object with a relatively small amount of calculation.

According to embodiments of the present disclosure, an attitude adjusting apparatus is provided. The attitude adjusting apparatus includes a driving device configured to include a motor, the motor configured to generate a driving force; and a controller configured to adjust an attitude of a target object by referring to a rotation angle of the motor, wherein the driving device includes: a sensing module configured to generate at least one magnetic field and sense a change of the at least one magnetic field; and a sensing target configured to be rotated by the driving force of the motor, the sensing target including one blade that is configured to change the at least one magnetic field generated by the sensing module. The controller is configured to determine the rotation angle of the motor by referring to the change of the at least one magnetic field sensed after a preset waiting time has elapsed from a point in time at which rotation of the motor is terminated.

According to one or more embodiments of the present disclosure, the sensing module includes: a coil configured to generate a first magnetic field; and a magnetic field sensor configured to sense the first magnetic field changed by the one blade and output a sensor value.

According to one or more embodiments of the present disclosure, the magnetic field sensor is configured to accumulate a plurality of sensing results of the at least one magnetic field changed by the one blade, and output a median value or an average value of the plurality of sensing results as the sensor value.

According to one or more embodiments of the present disclosure, the sensing module includes: a first coil configured to generate a first magnetic field; a second coil configured to generate a second magnetic field; a first magnetic field sensor configured to sense a change of the first magnetic field caused by the one blade and output a first sensor value; and a second magnetic field sensor configured to sense a change of the second magnetic field caused by the one blade and output a second sensor value.

According to one or more embodiments of the present disclosure, the controller is configured to determine the rotation angle of the motor by referring to: the first sensor value of the first magnetic field sensor for a first angle range of a rotation angle range of the motor; and the second sensor value of the second magnetic field sensor for a second angle range of the rotation angle range of the motor.

According to one or more embodiments of the present disclosure, a size of the first angle range and a size of the second angle range are different from each other.

According to one or more embodiments of the present disclosure, the first coil, the second coil, the first magnetic field sensor, and the second magnetic field sensor are on a single substrate of the sensing module.

According to one or more embodiments of the present disclosure, the controller is configured to feedback-control the motor by referring to a sensing result of the sensing module until the rotation angle of the motor is included in a target threshold range.

According to one or more embodiments of the present disclosure, the controller is configured to: obtain a target rotation angle of the motor, set a current angle of the motor as an initial angle, and control the motor to rotate to the target rotation angle based on the initial angle.

According to one or more embodiments of the present disclosure, the motor includes a stepping motor.

According to one or more embodiments of the present disclosure, the one blade includes metal.

According to one or more embodiments of the present disclosure, the target object includes a camera, the driving device is configured to adjust a pan of the camera, the attitude adjusting apparatus further includes an additional driving device configured to adjust a tilt of the camera, wherein the additional driving device includes: an additional sensing module configured to generate at least one magnetic field and sense a change of the at least one magnetic field generated by the additional sensing module; and an additional sensing target configured to be rotated by a driving force of a motor of the additional driving device, the additional sensing target including one blade that is configured to change the at least one magnetic field generated by the additional sensing module.

According to embodiments of the present disclosure, an attitude adjusting method is provided. The attitude adjusting method includes: receiving a control command for adjusting an attitude of a target object; driving a motor of a driving device of an attitude adjusting apparatus based on the control command; determining a rotation angle of the motor; and adjusting the attitude of the target object by referring to the rotation angle of the motor. The driving device includes: a sensing module configured to generate a magnetic field and sense a change of the magnetic field; and a sensing target configured to be rotated by a driving force of the motor, the sensing target including one blade that is configured to change the magnetic field generated by the sensing module, and the determining the rotation angle of the motor includes determining the rotation angle of the motor by referring to a change of the magnetic field sensed after a preset waiting time has elapsed from a point in time at which rotation of the motor is terminated.

According to one or more embodiments of the present disclosure, the sensing module includes: a coil configured to generate a first magnetic field; and a magnetic field sensor configured to sense the first magnetic field changed by the one blade and output a sensor value.

According to one or more embodiments of the present disclosure, the sensing module includes: a first coil configured to generate a first magnetic field; a second coil configured to generate a second magnetic field; a first magnetic field sensor configured to sense a change of the first magnetic field caused by the one blade and output a first sensor value; and a second magnetic field sensor configured to sense a change of the second magnetic field by the one blade and output a second sensor value.

According to one or more embodiments of the present disclosure, the determining of the rotation angle of the motor includes determining the rotation angle by referring to: the first sensor value of the first magnetic field sensor for a first angle range of a rotation angle range of the motor; and the second sensor value of the second magnetic field sensor for a second angle range of the rotation angle range of the motor.

According to one or more embodiments of the present disclosure, the first coil, the second coil, the first magnetic field sensor, and the second magnetic field sensor are on a single substrate of the sensing module.

According to one or more embodiments of the present disclosure, the adjusting the attitude of the target object includes feedback-controlling the motor by referring to a sensing result of the sensing module until the rotation angle of the motor is included in a target threshold range.

According to one or more embodiments of the present disclosure, the one blade includes metal.

According to one or more embodiments of the present disclosure, the target object includes a camera, and the driving device is configured to adjust one from among a pan of the camera and a tilt of the camera. The attitude adjusting apparatus further includes an additional driving device configured to adjust the other from among the pan of the camera and the tilt of the camera, wherein the additional driving device includes: an additional sensing module configured to generate at least one magnetic field and sense a change of the at least one magnetic field generated by the additional sensing module; and an additional sensing target configured to be rotated by a driving force of a motor of the additional driving device, the additional sensing target including one blade that is configured to change the at least one magnetic field generated by the additional sensing module.

Details of other embodiments of the present disclosure are included in the detailed description and drawings of the present disclosure.

According to embodiments of the present disclosure, since a direction can be changed by manual operation, there is an advantage that a user can easily move the driving device.

Effects of embodiments of the present disclosure are not limited to the effects mentioned above, and other effects not mentioned will be clearly understood by those skilled in the art from the descriptions of the present disclosure.

BRIEF DESCRIPTION OF DRAWINGS

The above and other aspects and features of embodiments of the present disclosure will become more apparent by describing in detail non-limiting example embodiments thereof with reference to the attached drawings, in which.

DETAILED DESCRIPTION

Figure 1:
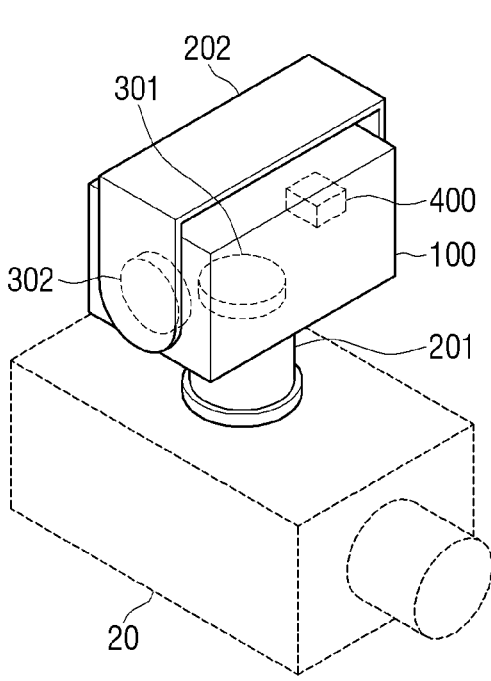
FIG. 1 is a view illustrating an attitude adjusting apparatus according to an example embodiment of the present disclosure.

Hereinafter, non-limiting examples embodiments of the present disclosure will be described in detail with reference to the accompanying drawings. Advantages and features of embodiments of the present disclosure will be apparent with reference to the example embodiments described below in detail together with the accompanying drawings. However, embodiments of the present disclosure are not limited to the example embodiments described below, and may be implemented in various different forms. The example embodiments are described to make the present disclosure complete, and to fully inform the scope of embodiments of the present disclosure to those of ordinary skill in the technical field to which the present disclosure belongs. The same reference numerals refer to the same components throughout the specification.

Unless otherwise defined, all terms (including technical and scientific terms) used in the present specification may have meanings that can be commonly understood by those of ordinary skill in the art to which the present disclosure belongs. In addition, terms defined in a commonly used dictionary are not interpreted ideally or excessively unless explicitly defined specifically.

It will be understood that when an element is referred to as being "on," "connected to," or "coupled to" another element, it can be directly on, connected to, or coupled to the other element or intervening elements may be present. In contrast, when an element is referred to as being "directly on," "directly connected to," or "directly coupled to" another element, there are no intervening elements present.

Figure 2:
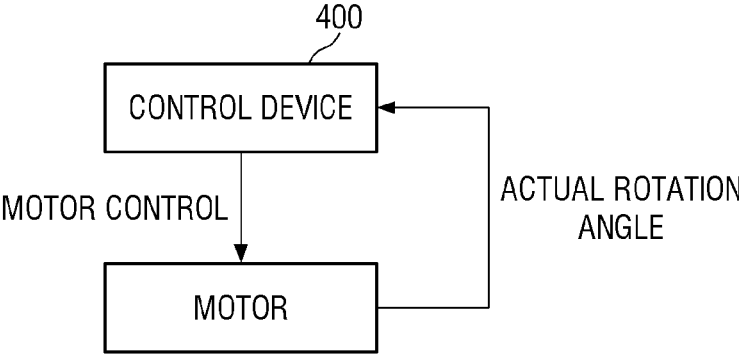
FIG. 2 is a diagram for explaining an operation of a control device according to an example embodiment of the present disclosure.

FIG. 1 is a view illustrating an attitude adjusting apparatus according to an example embodiment of the present disclosure, and FIG. 2 is a diagram for explaining an operation of a control device according to an example embodiment.

Referring to FIG. 1, an attitude adjusting apparatus 10 according to an example embodiment of the present disclosure includes a main body 100, at least one rotating body (e.g., a first rotating body 201 and a second rotating body 202), at least one driving device (e.g., a first driving device 301 and a second driving device 302), and a control device 400.

The main body 100 and the rotating bodies may be rotatably coupled to each other. The attitude adjusting apparatus 10 may include at least one rotating body. Hereinafter, it will be mainly described that the rotating bodies include a first rotating body 201 and a second rotating body 202.

The first rotating body 201 and the second rotating body 202 may rotate individually with respect to the main body 100. An attitude of the first rotating body 201 relative to the main body 100 and an attitude of the second rotating body 202 relative to the main body 100 may be individually determined.

The first rotating body 201 may be coupled to a target object 20, and the second rotating body 202 may be coupled to a reference object such as a wall. An attitude of the target object 20 relative to the reference object may be determined according to the attitudes of the first rotating body 201 and the second rotating body 202 relative to the main body 100. The target object 20 may include a camera. A shooting direction of the camera may be determined according to an attitude of the camera relative to the reference object.

The driving devices (e.g., a first driving device 301 and a second driving device 302) may generate a driving force for rotating the first rotating body 201 and the second rotating body 202 with respect to the main body 100. For example, the driving devices may generate the driving force using a motor included therein. The driving devices may be provided in the main body 100, but according to some example embodiments of the present disclosure, the driving devices may also be provided in the first rotating body 201 and the second rotating body 202. Hereinafter, it will be mainly described that the driving devices are provided in the main body 100.

The driving devices may include a first driving device 301 and a second driving device 302. The first driving device 301 may rotate the first rotating body 201 with respect to the main body 100, and the second driving device 302 may rotate the second rotating body 202 with respect to the main body 100. When the target object 20 is a camera, the first driving device 301 may perform pan adjustment of the camera, and the second driving device 302 may perform tilt adjustment of the camera.

The control device 400 may adjust an attitude of the target object 20. In particular, the control device 400 may adjust the attitude of the target object 20 by referring to the rotation angles of the motors provided in the first driving device 301 and the second driving device 302. For example, the control device 400 may receive a control command for directing the target object 20, which is the camera, in a specific direction. According to the control command, the control device 400 may drive the motors provided in the first driving device 301 and the second driving device 302. The attitude of the target object 20 may be adjusted while the first rotating body 201 and the second rotating body 202 rotate with respect to the main body 100 by the driving force of the motors.

On the other hand, when an error occurs between the control of the control device 400 and the operation of the motor, an error (hereinafter, referred to as an attitude error) may exist between a target attitude and an actual attitude of the target object 20. The attitude error of the target object 20 may be checked by referring to the rotation angle of the motor. Referring to FIG. 2, the control device 400 may control the motor to rotate at a target rotation angle. In addition, the control device 400 may check an actual rotation angle of the motor. The attitude error may occur when there is a difference between the target rotation angle and the actual rotation angle. In this case, the control device 400 may control the motor again to correct the attitude error. By the feedback control of the control device 400 as described above, it is possible to finely adjust the attitude of the target object 20.

The control device 400 may set a current angle of the motors provided in the first driving device 301 and the second driving device 302 as an initial angle, and may control the motors to rotate by a target rotation angle based on the initial angle. As will be described later, the rotation angle of the motor may be checked using a magnetic field sensor 363 (see FIG. 8). The magnetic field sensor 363 may provide a higher resolution result than a conventional photo interrupter (PI) sensor, store a specific rotation angle of the motor as a preset, and sense the rotation angle of the motor with relatively high accuracy even if the motor slips. In addition, the magnetic field sensor 363 also has advantages of being inexpensive compared to the conventional magnet sensor and less affected by surroundings such as a magnetic field. The control device 400 that controls the motor based on the initial angle will be described later in detail.

Figure 3:
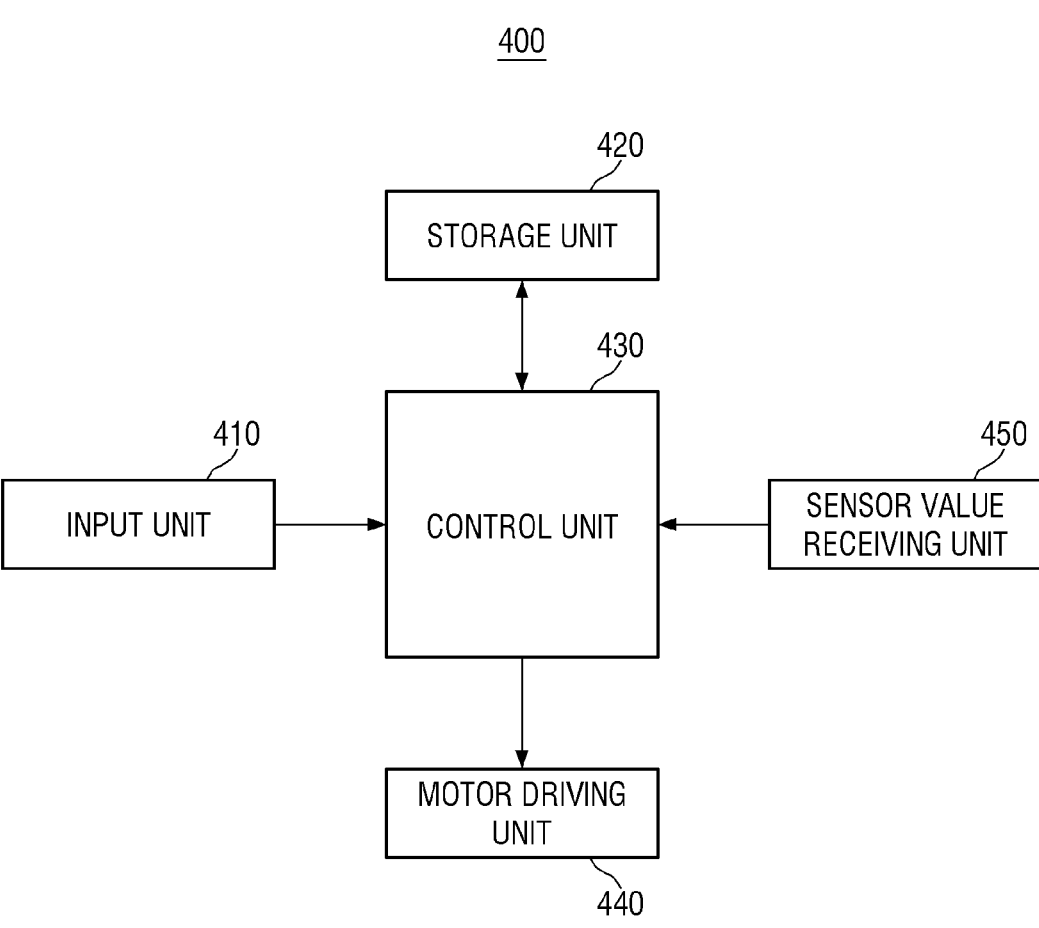
FIG. 3 is a block diagram of the control device.

FIG. 3 is a block diagram of the control device.

Referring to FIG. 3, the control device 400 includes an input unit 410, a storage unit 420 (e.g., a storage), a control unit 430 (e.g., a controller), a motor driving unit 440 (e.g., a motor driver), and a sensor value receiving unit 450 (e.g., a sensor value receiver).

The input unit 410 may receive the target rotation angle of the motor. The motor driving unit 440 may drive the motor to rotate at the target rotation angle. The motor may rotate according to a driving signal received from the motor driving unit 440. The input unit 410 may be or may include at least one of a keyboard, a mouse, a touch screen, a touch pen, etc., not being limited thereto.

The sensor value receiving unit 450 may receive a sensor value for the rotation angle of the motor. As will be described later, the first driving device 301 and the second driving device 302 include sensors for sensing the rotation angles of the motors, and the sensor value receiving unit 450 may receive a sensor value from the corresponding sensor. The sensor value receiving unit 450 may include at least one processor and memory, a modem, an antenna circuit, a WiFi chip, and related software and/or firmware to receive the sensor value.

The storage unit 420 may store a relationship between the sensor value of the sensor and the rotation angle of the motor (hereinafter, referred to as a sensor value-rotation angle relationship). For example, the storage unit 420 may store the sensor value-rotation angle relationship in a form of a graph illustrated in FIG. 12.

The control unit 430 may check the actual rotation angle of the motor by referring to the sensor value-rotation angle relationship. In addition, when there is a difference between the target rotation angle and the actual rotation angle, the control unit 430 may control the motor driving unit 440 to compensate for the difference. In addition, the control unit 430 may perform overall control of the input unit 410, the storage unit 420, the motor driving unit 440, and the sensor value receiving unit 450.

According to embodiments of the present disclosure, the control unit 430 may include at least one processor and memory storing computer instructions. The computer instructions, when executed by the at least one processor, may be configured to cause the at least one processor to perform any number of functions of the control device 400, including the functions of the control unit 430.

Figure 4:
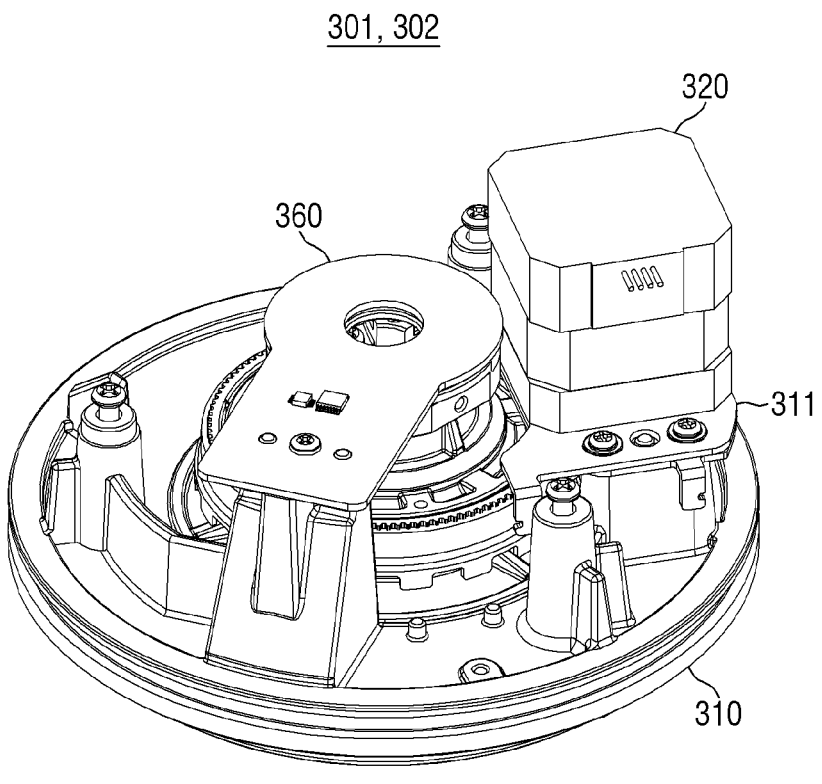
FIG. 4 is a perspective view of a driving device according to an example embodiment of the present disclosure.
Figure 5:
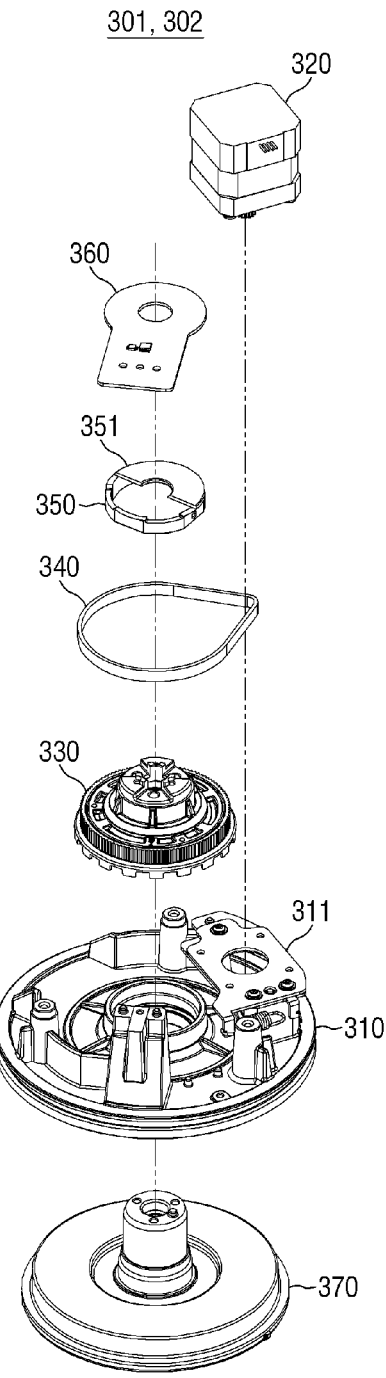
FIG. 5 is an exploded perspective view of the driving device.
Figure 6:
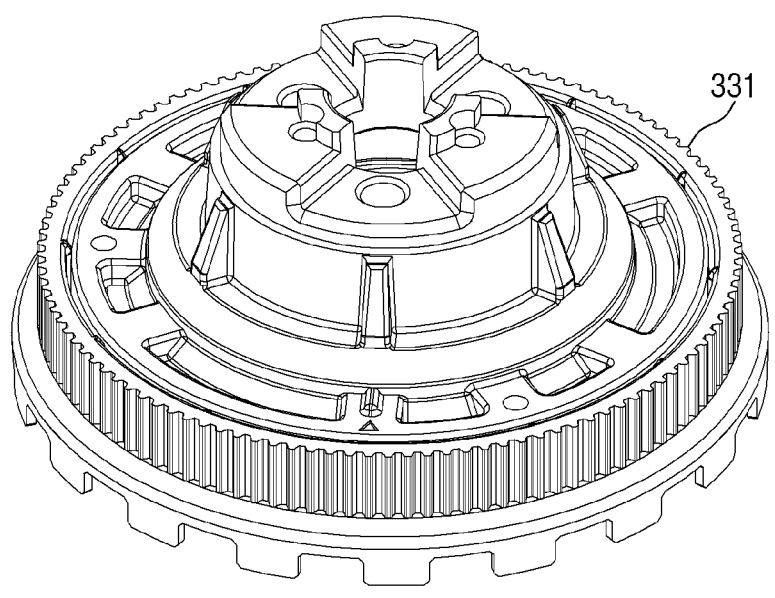
FIG. 6 is a perspective view of a rotor according to an example embodiment of the present disclosure.
Figure 7:
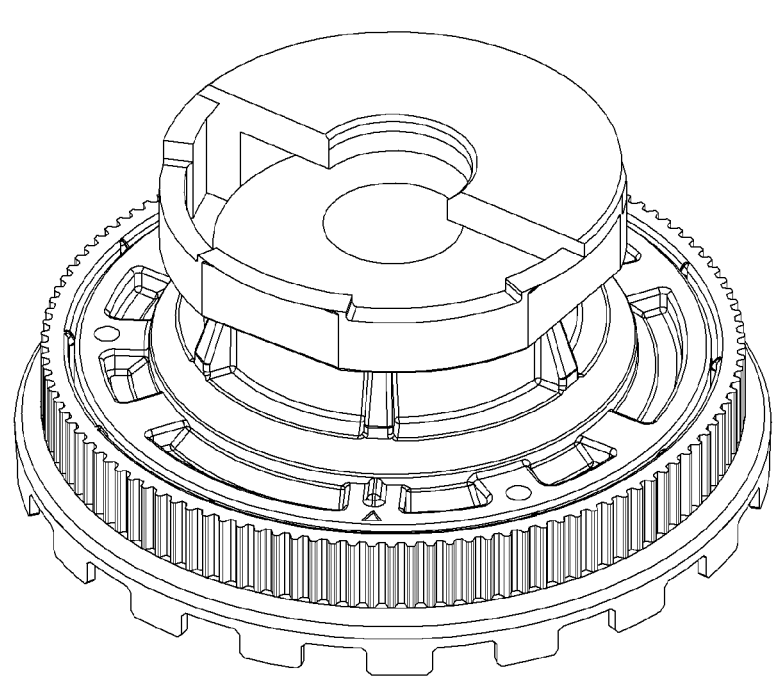
FIG. 7 is a perspective view of the rotor in which a target is integrally formed.
Figure 8:
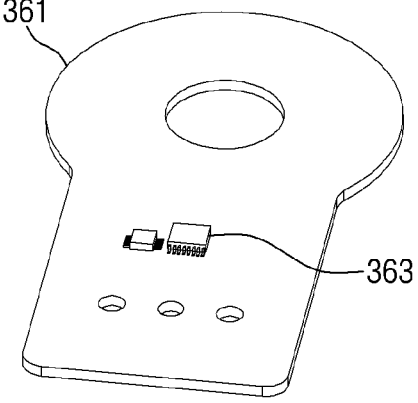
FIG. 8 is a perspective view of a sensing portion according to an example embodiment of the present disclosure.
Figure 9:
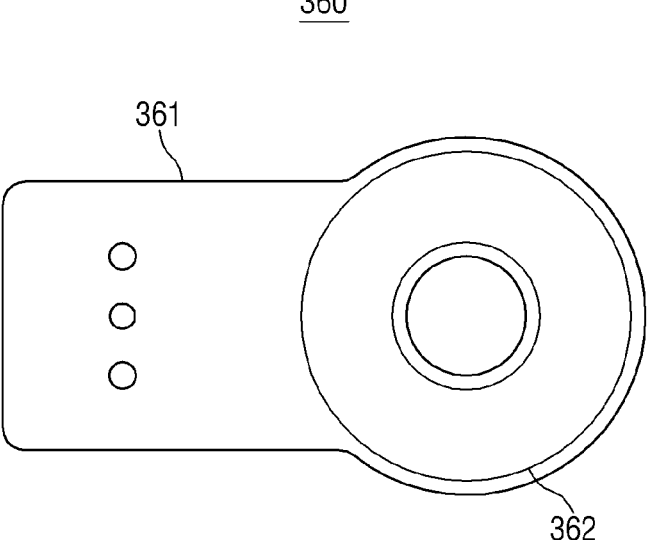
FIG. 9 is a bottom view of the sensing portion.
Figure 10:
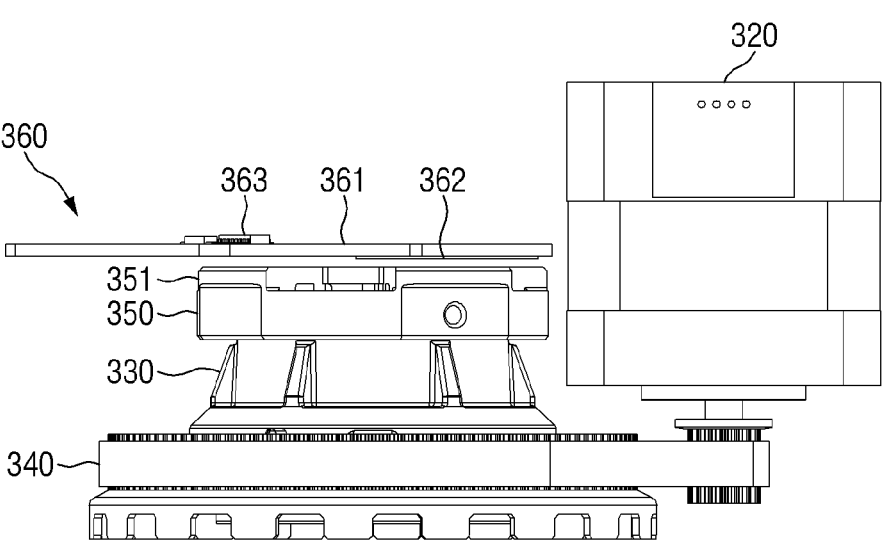
FIG. 10 is a view for explaining rotation of the motor sensed by the sensing portion.

FIG. 4 is a perspective view of a driving device according to an embodiment of the present disclosure, FIG. 5 is an exploded perspective view of the driving device, FIG. 6 is a perspective view of a rotor according to an embodiment of the present disclosure, FIG. 7 is a perspective view of the rotor in which a target is integrally formed, FIG. 8 is a perspective view of a sensing portion according to an embodiment of the present disclosure, FIG. 9 is a bottom view of the sensing portion, and FIG. 10 is a view for explaining rotation of the motor sensed by the sensing portion.

Referring to FIGS. 4 and 5, the first driving device 301 and the second driving device 302 may each include a base portion 310, a motor 320, a rotor 330, a power transmission portion 340, a target 350 (e.g., a sensing target), a sensing portion 360 (e.g., a sensing module), and a rotating portion 370.

The base portion 310 may provide a reference for rotation of the rotor 330. The rotor 330 may rotate with respect to the base portion 310. The base portion 310 may be fixed to the main body 100. The rotor(s) 330 may provide a driving force to the first rotating body 201 and the second rotating body 202 by rotating with respect to the main body 100 (refer to FIG. 1).

In addition, the base portion 310 may serve to integrate a plurality of parts provided in the first driving device 301 and the second driving device 302. The plurality of parts provided in the first driving device 301 and the second driving device 302 may be directly or indirectly coupled to the base portion 310. For example, the base portion 310 may include a motor plate 311 for coupling of the motor 320. Since the plurality of parts are integrally coupled, the first driving device 301 and the second driving device 302 may be conveniently operated.

The motor 320 may generate driving force. In embodiments of the present disclosure, the motor 320 may be a stepping motor. Therefore, the motor 320 may rotate at an angle corresponding to an input signal.

The rotor 330 may rotate by the driving force of the motor 320. The power transmission portion 340 may be provided between the motor 320 and the rotor 330. FIG. 5 illustrates the power transmission portion 340 in the form of a belt, but according to some example embodiments of the present disclosure, the power transmission portion 340 may also be provided in the form of a gear or a wire. Alternatively, when the motor 320 and the rotor 330 are directly coupled to each other, the power transmission portion 340 may also be omitted.

The driving force of the motor 320 may be transmitted to the rotor 330 through the power transmission portion 340. Referring to FIG. 6, a gear 331 may be provided in the rotor 330. The gear 331 of the rotor 330 may be gear-coupled to the power transmission portion 340. When the motor 320 rotates, the driving force of the motor 320 may be transmitted to the rotor 330 through the power transmission portion 340, and the rotor 330 may rotate together with the motor 320.

According to some example embodiments of the present disclosure, the target 350 and the rotor 330 may be integrally formed. FIG. 7 illustrates a rotor 380 that includes a target as a portion of a body of the rotor 380. When the target is formed on the rotor 380, the rest of the rotor 380 and the target may be made of the same material. Alternatively, the rest of the rotor 380 and the target may be made of different materials in a double injection method. Hereinafter, it will be mainly described that the target 350 and the rotor 330 are separately provided.

Referring back to FIGS. 4 and 5, the target 350 may rotate by the driving force of the motor 320. The target 350 may be coupled to the rotor 330. When the rotor 330 rotates by the driving force of the motor 320, the target 350 may rotate together with the rotor 330. The target 350 may include one blade 351 to change a magnetic field generated by the sensing portion 360. The blade 351 may be made of a metal material. For example, the blade 351 may be made of an aluminum material. When the blade 351 moves in the magnetic field generated by the sensing portion 360, the magnetic field may change.

The sensing portion 360 may generate the magnetic field and sense a change of the generated magnetic field. Referring to FIGS. 8 and 9, the sensing portion 360 includes a substrate 361, a coil 362, and a magnetic field sensor 363.

The substrate 361 may fix the coil 362 and the magnetic field sensor 363. In addition, the substrate 361 may supply a current to the coil 362 and supply power to the magnetic field sensor 363.

The coil 362 may generate a magnetic field. The coil 362 may be disposed on one side surface of the substrate 361 in a ring shape. As the current is supplied to the coil 362, the magnetic field may be generated around the coil 362.

Referring to FIGS. 8 to 10, the magnetic field sensor 363 may sense the magnetic field changed by the blade 351 and output a sensor value.

The coil 362 may be disposed on one surface of the substrate 361 facing the blade 351. The target 350 may rotate together with the rotor 330 by the driving force of the motor 320. While the target 350 rotates, the blade 351 may move around the coil 362. When the blade 351 made of the metal material moves around the coil 362, the magnetic field may change. The magnetic field sensor 363 may continuously sense the magnetic field around the coil and output a sensor value, which is a sensing result. For example, the sensor value may be a magnitude of the magnetic field. The range of the sensor value may correspond to the range of the rotation angle of the motor 320.

Referring again to FIGS. 4 and 5, the rotating portion 370 may output a rotational force of the rotor 330. The rotating portion 370 may be fixedly coupled to the rotor 330. As the rotor 330 rotates, the rotating portion 370 may rotate together with the rotor 330. The rotating portion 370 may be coupled to the first rotating body 201 and the second rotating body 202. The rotational force of the rotor(s) 330 may be transmitted to the first rotating body 201 and the second rotating body 202 through the rotating portion 370. The base portion 310 may be fixed to the main body 100 (refer to FIG. 1), and the rotating portion 370 may be rotatably coupled with respect to the base portion 310. As a result, the first rotating body 201 and the second rotating body 202 may rotate with respect to the main body 100 by the driving force of the motor 320.

Figure 11:
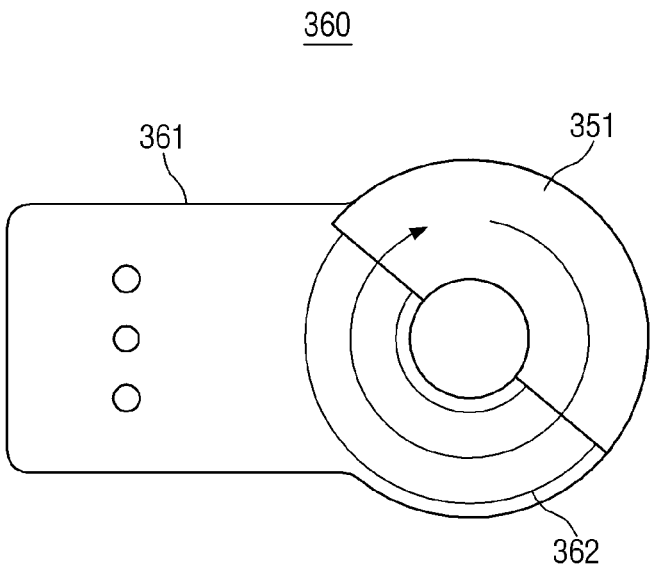
FIG. 11 is a view illustrating that a blade rotates with respect to the sensing portion.

FIG. 11 is a view illustrating that the blade rotates with respect to the sensing portion.

Referring to FIG. 11, the blade 351 may rotate around the coil 362.

When the current is supplied to the coil 362, a magnetic field may be generated around the coil 362. When the blade 351 made of the metal material rotates around the coil 362, the magnetic field may change.

In embodiments of the present disclosure, the target 350 may include one blade 351. For example, the blade 351 may be provided in a shape of a semicircular plate. Since one blade 351 rotates around the coil 362, a rotation period of the motor 320 and a period of change of the magnetic field may be formed to be identical to each other. For example, when the motor 320 rotates once, a change of the magnetic field of one period may be formed.

Since the rotation period of the motor 320 and the period of change of the magnetic field are identical to each other, the rotation angle of the motor 320 may be easily checked by sensing the change of the magnetic field caused by the blade 351. That is, since a specific sensor value of the magnetic field sensor 363 corresponds to a specific rotation angle of the motor 320, it is possible to determine the rotation angle of the motor 320 only with the sensor value output from the magnetic field sensor 363.

Figure 12:
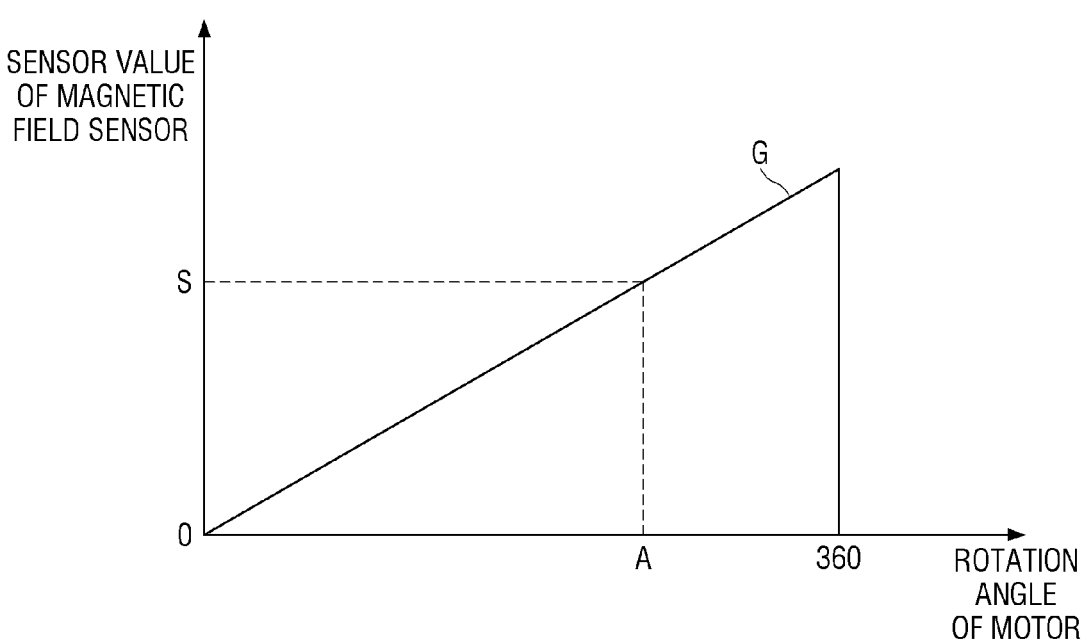
FIG. 12 is a graph illustrating a rotation angle of a motor relative to a sensor value of a magnetic field sensor.
Figure 13:
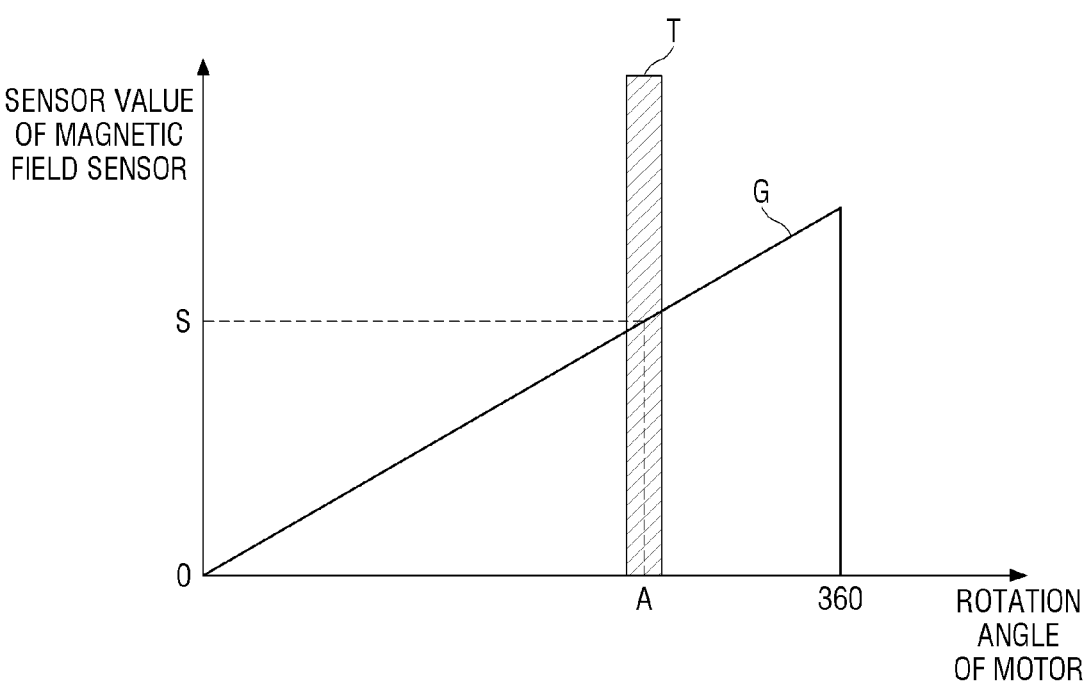
FIG. 13 is a view illustrating a target threshold range according to an example embodiment of the present disclosure.

FIG. 12 is a graph illustrating a rotation angle of a motor relative to a sensor value of a magnetic field sensor, and FIG. 13 is a view illustrating a target threshold range.

Referring to FIG. 12, a correspondence relationship may be formed between the sensor value of the magnetic field sensor 363 and the rotation angle of the motor 320, and the relationship between the sensor value and the rotation angle (sensor value-rotation angle relationship) may be provided in the form of a graph G.

The rotation angle of the motor 320 may be formed over a rotation angle range of 0 to 360 degrees. The control unit 430 of the control device 400 may determine the rotation angle of the motor 320 with reference to the graph G illustrated in FIG. 12. The control unit 430 determines the rotation angle of the motor 320 by applying the sensor value of the magnetic field sensor 363 to the graph G. FIG. 12 illustrates that the rotation angle of the motor 320 corresponding to a sensor value S of the magnetic field sensor 363 is a rotation angle value A. Accordingly, when the sensor value S is input as the sensor value from the magnetic field sensor 363, the control unit 430 may determine that the rotation angle of the motor 320 is the rotation angle value A.

In embodiments of the present disclosure, the control device 400 may feedback-control the motor 320 by referring to a sensing result of the sensing portion 360 until the rotation angle of the motor 320 is included in a target threshold range T. The target threshold range T may be set by referring to a target rotation angle of the motor 320 input through the input unit 410. The target threshold range T having a boundary of a predetermined interval based on the target rotation angle may be set. For example, when the target rotation angle is 270 degrees and a preset interval is 3 degrees, a target threshold range T of 267 to 273 degrees may be set.

FIG. 13 illustrates that an actual rotation angle of the motor 320 is included in the target threshold range T. In this case, the control unit 430 of the control device 400 may not perform additional control of the motor 320. Meanwhile, when the actual rotation angle of the motor 320 is out of the target threshold range T, the control unit 430 may perform feedback control of the motor 320. For example, when an interval of 5 degrees exists between the center of the target threshold range T and the actual rotation angle of the motor 320, the control unit 430 may rotate the motor 320 by 5 degrees.

After the motor 320 rotates, the control unit 430 may receive the sensor value of the magnetic field sensor 363. In addition, the control unit 430 may determine the actual rotation angle of the motor 320 by referring to the sensor value, and determine whether the corresponding rotation angle is included in the target threshold range T. As a result, when the rotation angle is included in the target threshold range T, the control unit 430 may omit additional control of the motor 320. On the other hand, when the rotation angle is still not included in the target threshold range T, the control unit 430 may perform feedback control of the motor 320 again. The feedback control of the motor 320 by the control unit 430 may be performed until the rotation angle of the motor 320 is included in the target threshold range T.

As described above, in embodiments of the present disclosure, the target object 20 may include the camera. When the target object 20 is the camera, the target rotation angle may be input to determine a shooting direction of the camera. In order to rotate the target object 20 to the target rotation angle, the control unit 430 may determine a current angle of the motor 320. The control unit 430 sets the current angle of the motor 320 as an initial angle and rotates the target object 20 to the target rotation angle based on the initial angle. For example, when the initial angle is 20 degrees and the target rotation angle is 280 degrees, the control unit 430 may rotate the motor 320 at an angle of 260 degrees.

The initial angle may be set without using a separate sensing means such as a photo interrupter (PI) sensor. For example, the control unit 430 may set the rotation angle of the motor 320 corresponding to the sensor value of the magnetic field sensor 363 as the initial angle. Since the magnetic field sensor 363 outputs a higher resolution sensor value than the PI sensor, the initial angle set using the sensor value of the magnetic field sensor 363 may provide relatively high accuracy.

In embodiments of the present disclosure, the initial angle may also be an angle of the motor 320 at a point in time at which the target object 20 is installed. The control unit 430 may control the motor 320 based on the initial angle set at the corresponding point in time, and repeat such a process.

Figure 14:
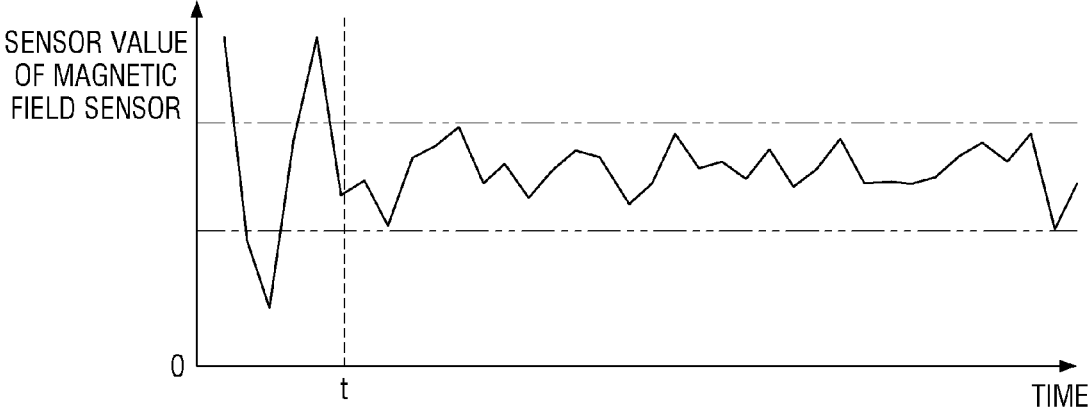
FIG. 14 is a graph illustrating a change of a sensor value over time.

FIG. 14 is a graph illustrating a change of a sensor value over time.

Referring to FIG. 14, the sensor value of the magnetic field sensor 363 may change over time after the rotation of the motor 320 is terminated.

The motor 320 may rotate by a predetermined angle under the control of the control unit 430. As the motor(s) 320 rotates, the first rotating body 201 and the second rotating body 202 may rotate with respect to the main body 100. When the rotation of the motor(s) 320 is terminated, the rotation of the first rotating body 201 and the second rotating body 202 relative to the main body 100 may also be terminated. In this case, vibration of the first rotating body 201 and the second rotating body 202 relative to the main body 100 may be generated by an inertial force of the first rotating body 201 and the second rotating body 202. The vibration of the first rotating body 201 and the second rotating body 202 may be maintained for a certain period of time.

The magnetic field sensor 363 may calculate a sensor value by continuously sensing the change of a magnetic field. Since the amplitude of the sensor value calculated by the magnetic field sensor 363 in the state in which the first rotating body 201 and the second rotating body 202 vibrate may be too large, the sensor value may have low accuracy. Accordingly, the control device 400 may determine the rotation angle of the motor 320 by referring to the change of magnetic field sensed after a waiting time t, that is preset, has elapsed from a point in time at which the rotation of the motor 320 is terminated. Here, the waiting time t is a time during which the vibration of the first rotating body 201 and the second rotating body 202 is predicted to be removed, and may be set in advance through experiments.

When the waiting time t elapses from the point in time at which the rotation of the motor 320 is terminated, the vibration of the first rotating body 201 and the second rotating body 202 may be removed, and the sensor value of the magnetic field sensor 363 may be formed with relatively small amplitude. The magnetic field sensor 363 may output the sensor value. For example, the magnetic field sensor 363 may output a median value or an average value of amplitude as the sensor value. More specifically, the magnetic field sensor 363 may accumulate a plurality of sensing results of the magnetic field changed by the blade 351 and output a median value or an average value of the plurality of accumulated sensing results as the sensor value. The control unit 430 may determine the rotation angle of the motor 320 by referring to the sensor value output from the magnetic field sensor 363.

When the rotation angle of the motor 320 is determined using the target 350 including only one blade 351, accuracy may be reduced compared to the case of using the target 350 including a plurality of blades. According to embodiments of the present disclosure, the rotation angle of the motor 320 may be determined by referring to the sensor value formed with the relatively small amplitude after the waiting time t has elapsed from the point in time at which the rotation of the motor 320 is terminated. Accordingly, the accuracy of determining the rotation angle of the motor 320 may be improved.

Figure 15:
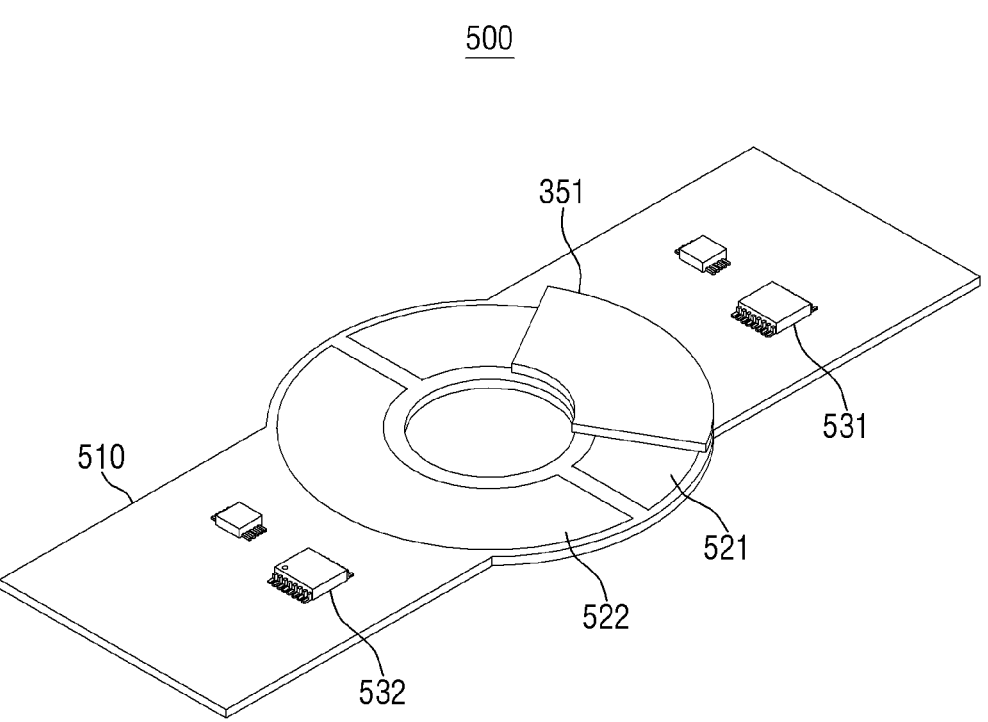
FIG. 15 is a view illustrating a sensing portion according to another example embodiment of the present disclosure.
Figure 16:
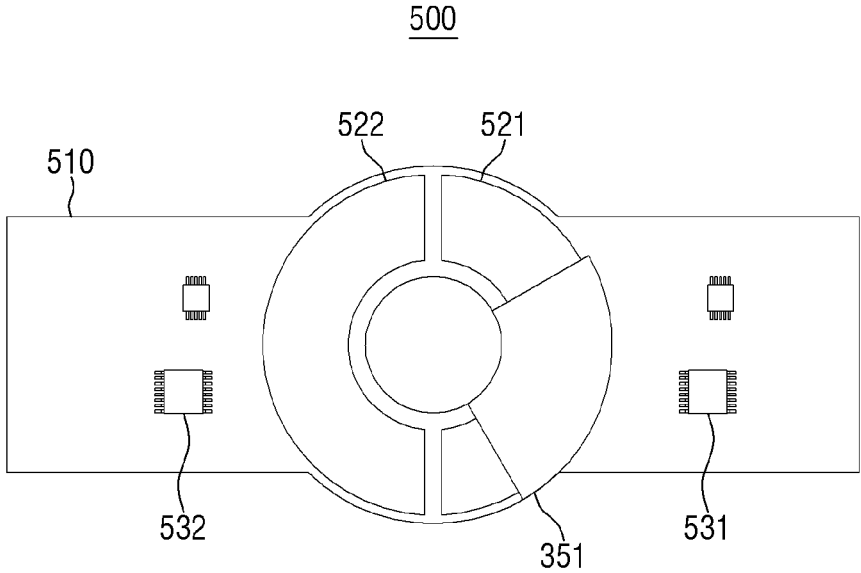
FIG. 16 is a view illustrating that the blade changes a first magnetic field.
Figure 17:
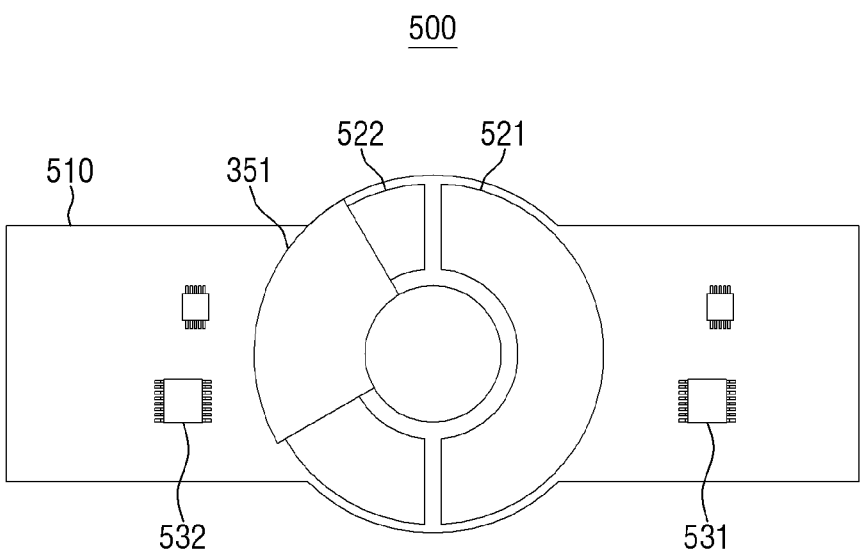
FIG. 17 is a view illustrating that the blade changes a second magnetic field.
Figure 18:
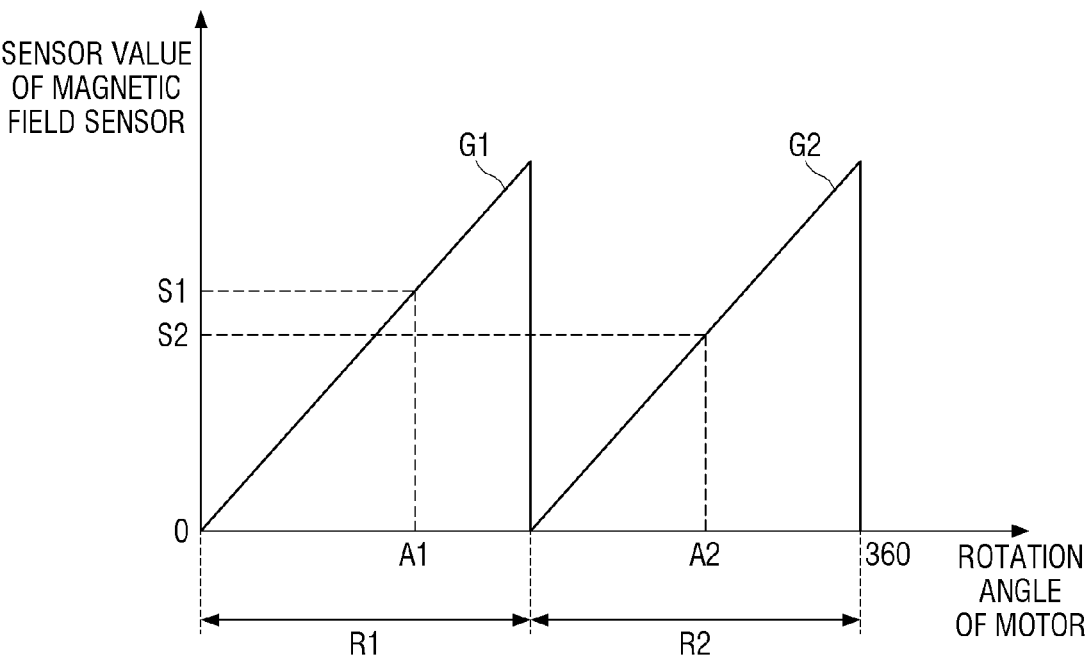
FIG. 18 is a graph illustrating the rotation angle of the motor with respect to sensor values of a first magnetic field sensor and a second magnetic field sensor.

FIG. 15 is a view illustrating a sensing portion according to another example embodiment of the present disclosure, FIG. 16 is a view illustrating that the blade changes a first magnetic field, FIG. 17 is a view illustrating that the blade changes a second magnetic field, and FIG. 18 is a graph illustrating the rotation angle of the motor 320 with respect to sensor values of a first magnetic field sensor and a second magnetic field sensor.

Referring to FIGS. 15 to 17, a sensing portion 500 according to another example embodiment of the present disclosure includes a substrate 510, a first coil 521, a second coil 522, a first magnetic field sensor 531, and a second magnetic field sensor 532.

FIGS. 15 to 17 illustrate the sensing portion 500 having two coils (the first coil 521 and the second coil 522) and two magnetic field sensors (the first magnetic field sensor 531 and the second magnetic field sensor 532), but this is merely an example. According to some example embodiments, the sensing portion 500 may also include three or more coils and three or more magnetic field sensors, respectively. In any case, each magnetic field sensor may sense a change of the magnetic field of one corresponding coil. Hereinafter, the sensing portion 500 having the first coil 521 and the second coil 522 and the first magnetic field sensor 531 and the second magnetic field sensor 532 will be mainly described.

The substrate 510 may fix the first coil 521, the second coil 522, the first magnetic field sensor 531, and the second magnetic field sensor 532. In addition, the substrate 510 may supply current to the first coil 521 and the second coil 522 and supply power to the first magnetic field sensor 531 and the second magnetic field sensor 532.

The first coil 521 may generate a first magnetic field, and the second coil 522 may generate a second magnetic field. As the current is supplied to the first coil 521 and the second coil 522, different magnetic fields may be generated around the first coil 521 and the second coil 522. The first coil 521 and the second coil 522 may be disposed in an arc shape on one side surface of the substrate 510. For example, the first coil 521 and the second coil 522 may be provided in a semicircular shape. A coil combination having a ring shape may be formed by combining the first coil 521 and the second coil 522.

The first magnetic field sensor 531 and the second magnetic field sensor 532 may sense magnetic fields changed by the blade 351 and output sensor values, respectively. The first magnetic field sensor 531 may sense a change of the first magnetic field caused by the blade 351 and output a sensor value corresponding thereto, and the second magnetic field sensor 532 may sense a change of the second magnetic field caused by the blade 351 and output a sensor value corresponding thereto.

The first coil 521 and the second coil 522 may be disposed on the same surface of the substrate 510 facing the blade 351. The target 350 may rotate together with the rotor 330 by the driving force of the motor 320. While the target 350 rotates, the blade 351 may move around the first coil 521 and the second coil 522. When the blade 351 made of the metal material moves around the first coil 521 and the second coil 522, the first magnetic field and the second magnetic field may be changed. The first magnetic field sensor 531 and the second magnetic field sensor 532 may continuously sense the first magnetic field and the second magnetic field formed around the first coil 521 and the second coil 522, and output the sensor values, which are sensing results, respectively.

In embodiments of the present disclosure, the target 350 may include one blade 351. Since one blade 351 rotates around the first coil 521 and the second coil 522, a rotation period of the motor 320 and a rotation period of the blade 351 may be formed to be identical to each other. For example, when the motor 320 rotates once, the blade 351 may also rotate once based on an axis of rotation of the motor 320.

Since the rotation period of the motor 320 and the rotation period of the blade 351 are identical to each other, the rotation angle of the motor 320 may be easily checked by sensing the change of the magnetic field(s) caused by the blade 351.

As illustrated in FIG. 16, when the blade 351 moves adjacent to the first coil 521, the first magnetic field may be changed, and as illustrated in FIG. 17, when the blade 351 moves adjacent to the second coil 522, the second magnetic field may be changed. The change of the first magnetic field and the change of the second magnetic field may be sequentially performed, and the sequential change of the magnetic fields may be repeated.

The change of the first magnetic field may correspond to a predetermined range R1 (refer to FIG. 18) of the rotation angle range of the motor 320, and the change of the second magnetic field may correspond to another predetermined range R2 (refer to FIG. 18) of the rotation angle range of the motor 320. Referring to FIG. 18, a correspondence relationship may be formed between the sensor values of the first magnetic field sensor 531 and the second magnetic field sensor 532 and the rotation angle of the motor 320, and the relationship between the sensor values and the rotation angle (sensor value-rotation angle relationship) may be provided in the form of a graph G1 and a graph G2. Hereinafter, the graph G1 illustrating the relationship between the sensor value of the first magnetic field sensor 531 and the rotation angle of the motor 320 is referred to as a first graph, and the graph G2 illustrating the relationship between the sensor value of the second magnetic field sensor 532 and the rotation angle of the motor 320 is referred to as a second graph.

The rotation angle of the motor 320 may be formed over a rotation angle range of 0 to 360 degrees. The control device 400 may refer to the sensor value of the first magnetic field sensor 531 for the first angle range R1 of the rotation angle range of the motor 320, and may refer to the sensor value of the second magnetic field sensor 532 for the second angle range R2 of the rotation angle range of the motor 320. Specifically, the control unit 430 of the control device 400 may determine the rotation angle of the motor 320 by referring to the first graph G1 and the second graph G2. The control unit 430 determines the rotation angle of the motor 320 by applying the sensor value of the first magnetic field sensor 531 to the first graph G1 or applying the sensor value of the second magnetic field sensor 532 to the second graph G2. When the sensor value of the first magnetic field sensor 531 is a sensor value S1, the control unit 430 may determine that the rotation angle of the motor 320 is a rotation angle value A1. Similarly, when the sensor value of the second magnetic field sensor 532 is a sensor value S2, the control unit 430 may determine that the rotation angle of the motor 320 is a rotation angle value A2.

The sizes of the first angle range R1 and the second angle range R2 of the rotation angle range of the motor 320 may be the same or different. For example, when the size of the first coil 521 is greater than the size of the second coil 522, the size of the first angle range R1 may also be formed to be greater than the size of the second angle range R2. Alternatively, when the size of the first coil 521 is the same as the size of the second coil 522, the size of the first angle range R1 may also be formed to be the same as the size of the second angle range R2. The size of the first coil 521 and the size of the second coil 522 may be appropriately determined according to a design environment, a manufacturing environment, or an operating environment, and the control unit 430 may determine the rotation angle of the motor 320 by referring to the sensor value of each magnetic field sensor.

As described above, when the rotation angle of the motor 320 is determined using the target 350 including only one blade 351, the accuracy may be reduced compared to the case of using the target 350 including a plurality of blades. According to example embodiments of the present disclosure, since the sensor values of different magnetic field sensors are referred to for different angle ranges of the rotation angle range of the motor 320, accuracy of determining the rotation angle of the motor 320 may be improved. In addition, since the first coil 521, the second coil 522, the first magnetic field sensor 531, and the second magnetic field sensor 532 are disposed on one substrate 510, design and manufacturing costs of the sensing portion 500 may be reduced.

Figure 19:
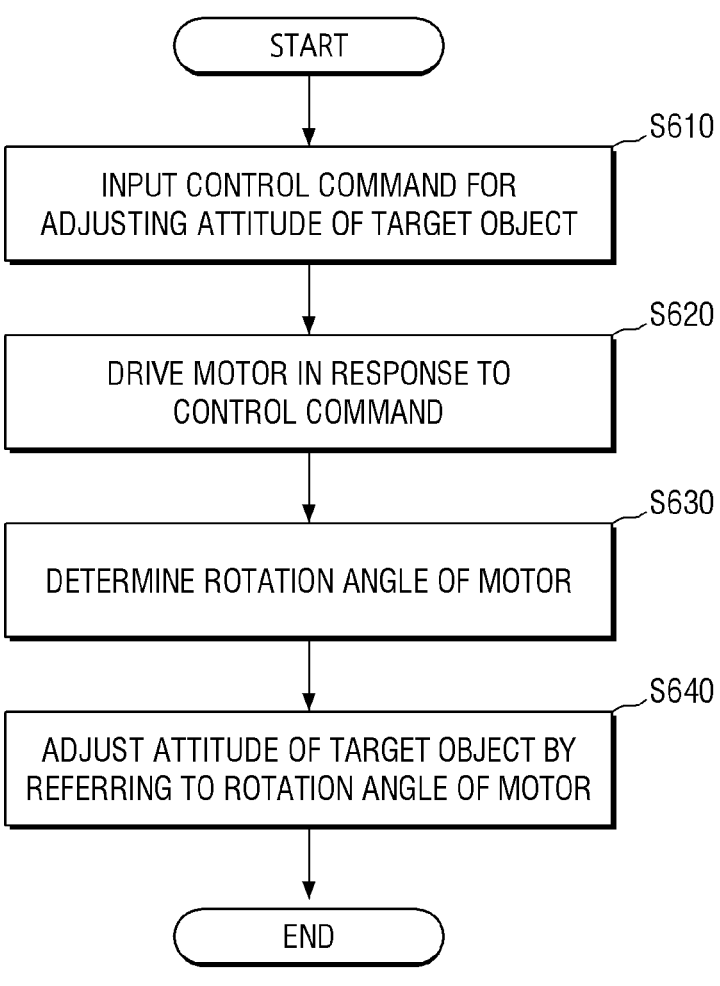
FIG. 19 is a flowchart illustrating an attitude adjusting method according to an example embodiment of the present disclosure.

FIG. 19 is a flowchart illustrating an attitude adjusting method according to an example embodiment of the present disclosure.

Referring to FIG. 19, the control device 400 may adjust an attitude of the target object 20 through feedback control.

First, the control device 400 may receive a control command for adjusting the attitude of the target object 20 (step S610). As the control command is input, the control device 400 may drive the motor 320 provided in one or more of the first driving device 301 and the second driving device 302 in response to the control command (step S620), and determine a rotation angle of the motor 320 (step S630). The rotation angle of the motor 320 may be determined by referring to the sensor value of the magnetic field sensor.

In addition, the control device 400 may adjust the attitude of the target object 20 by referring to the rotation angle of the motor 320 (S640). That is, the control device 400 feedback-controls the motor 320 by referring to a sensing result of the sensing portion 360, that is, the sensor value of the magnetic field sensor until the rotation angle of the motor 320 is included in a target threshold range T.

In determining the rotation angle of the motor 320, the control device 400 may determine the rotation angle of the motor 320 by referring to a change of magnetic field sensed after a preset waiting time t has elapsed from a point in time at which the rotation of the motor 320 is terminated. As described above, since the sensor value is formed with the relatively small amplitude after the waiting time t elapses from the point in time at which the rotation of the motor 320 is terminated, the accuracy of determining the rotation angle of the motor 320 may be improved.

According to embodiments of the present disclosure, step S620, step S630, and/or step S640 may be performed separately or simultaneously with respect to the motor 320 of the first driving device 301 and the motor 320 of the second driving device 302.

Although example embodiments of the present disclosure have been described with reference to the above and the accompanying drawings, those of ordinary skill in the art, to which the present disclosure pertains, can understand that embodiments of the present disclosure may be implemented in other specific forms without departing from the scope of the present disclosure. Therefore, it should be understood that the example embodiments described above are illustrative and non-limiting in all respects.

What is claimed is:

1. An attitude adjusting apparatus comprising:
   a driving device configured to include a motor, the motor configured to generate a driving force for rotating a rotating body; and
   a controller configured to adjust an attitude of a target object by referring to a rotation angle of the motor,
   wherein the driving device comprises:

a sensing module configured to generate at least one magnetic field and sense a change of the at least one magnetic field; and a sensing target configured to be rotated by the driving force of the motor, the sensing target comprising one blade that is configured to change the at least one magnetic field generated by the sensing module, wherein the controller is configured to determine the rotation angle of the motor by referring to the change of the at least one magnetic field sensed after a preset waiting time has elapsed from a point in time at which rotation of the motor is terminated, and wherein the preset waiting time is a time during which vibration of the rotating body is predicted to be removed, and wherein the sensing module comprises:

a first coil configured to generate a first magnetic field;

a second coil configured to generate a second magnetic field;

a first magnetic field sensor configured to sense a change of the first magnetic field caused by the one blade and output a first sensor value; and a second magnetic field sensor configured to sense a change of the second magnetic field caused by the one blade and output a second sensor value.

2. The attitude adjusting apparatus of claim 1, wherein each of the first magnetic field sensor and the second magnetic field sensor is configured to accumulate a plurality of sensing results of the at least one magnetic field changed by the one blade, and output a median value or an average value of the plurality of sensing results as the first sensor value or the second sensor value.

3. The attitude adjusting apparatus of claim 1, wherein the controller is configured to determine the rotation angle of the motor by referring to:

the first sensor value of the first magnetic field sensor for a first angle range of a rotation angle range of the motor; and the second sensor value of the second magnetic field sensor for a second angle range of the rotation angle range of the motor.

4. The attitude adjusting apparatus of claim 3, wherein a size of the first angle range and a size of the second angle range are different from each other.

5. The attitude adjusting apparatus of claim 1, wherein the first coil, the second coil, the first magnetic field sensor, and the second magnetic field sensor are on a single substrate of the sensing module.

6. The attitude adjusting apparatus of claim 1, wherein the controller is configured to feedback-control the motor by referring to a sensing result of the sensing module until the rotation angle of the motor is included in a target threshold range.

7. The attitude adjusting apparatus of claim 1, wherein the controller is configured to:

obtain a target rotation angle of the motor, set a current angle of the motor as an initial angle, and control the motor to rotate to the target rotation angle based on the initial angle.

8. The attitude adjusting apparatus of claim 1, wherein the motor comprises a stepping motor.

9. The attitude adjusting apparatus of claim 1, wherein the one blade comprises metal.

10. The attitude adjusting apparatus of claim 1, wherein the target object comprises a camera, the driving device is configured to adjust a pan of the camera, the attitude adjusting apparatus further comprises an additional driving device configured to adjust a tilt of the camera, wherein the additional driving device comprises:

an additional sensing module configured to generate at least one magnetic field and sense a change of the at least one magnetic field generated by the additional sensing module; and an additional sensing target configured to be rotated by a driving force of a motor of the additional driving device, the additional sensing target comprising one blade that is configured to change the at least one magnetic field generated by the additional sensing module.

11. An attitude adjusting method comprising:

receiving a control command for adjusting an attitude of a target object;

driving a motor of a driving device of an attitude adjusting apparatus based on the control command;

determining a rotation angle of the motor; and adjusting the attitude of the target object by referring to the rotation angle of the motor, wherein the driving device includes:

a sensing module configured to generate a magnetic field and sense a change of the magnetic field; and a sensing target configured to be rotated by a driving force of the motor, the sensing target including one blade that is configured to change the magnetic field generated by the sensing module, wherein the determining the rotation angle of the motor comprises determining the rotation angle of the motor by referring to a change of the magnetic field sensed after a preset waiting time has elapsed from a point in time at which rotation of the motor is terminated, wherein the motor configured to generate a driving force for rotating a rotating body, and wherein the preset waiting time is a time during which vibration of the rotating body is predicted to be removed, and wherein the sensing module includes:

a first coil configured to generate a first magnetic field;

a second coil configured to generate a second magnetic field;

a first magnetic field sensor configured to sense a change of the first magnetic field caused by the one blade and output a first sensor value; and a second magnetic field sensor configured to sense a change of the second magnetic field by the one blade and output a second sensor value.

12. The attitude adjusting method of claim 11, wherein the determining of the rotation angle of the motor comprises determining the rotation angle by referring to:

the first sensor value of the first magnetic field sensor for a first angle range of a rotation angle range of the motor; and the second sensor value of the second magnetic field sensor for a second angle range of the rotation angle range of the motor.

13. The attitude adjusting method of claim 11, wherein the first coil, the second coil, the first magnetic field sensor, and the second magnetic field sensor are on a single substrate of the sensing module.

14. The attitude adjusting method of claim 11, wherein the adjusting the attitude of the target object comprises feedback-controlling the motor by referring to a sensing result of the sensing module until the rotation angle of the motor is included in a target threshold range.

15. The attitude adjusting method of claim 11, wherein the one blade comprises metal.

16. The attitude adjusting method of claim 11, wherein the target object includes a camera, the driving device is configured to adjust one from among a pan of the camera and a tilt of the camera, and the attitude adjusting apparatus further includes an additional driving device configured to adjust the other from among the pan of the camera and the tilt of the camera, wherein the additional driving device includes:

an additional sensing module configured to generate at least one magnetic field and sense a change of the at least one magnetic field generated by the additional sensing module; and an additional sensing target configured to be rotated by a driving force of a motor of the additional driving device, the additional sensing target including one blade that is configured to change the at least one magnetic field generated by the additional sensing module.

\* \* \* \* \*